US012209821B2

(12) United States Patent
Chen et al.

(10) Patent No.: US 12,209,821 B2
(45) Date of Patent: Jan. 28, 2025

(54) MICROCHANNEL HEAT SINK CONFIGURATION FOR OPTIMAL DEVICE COOLING

(71) Applicant: Advanced Liquid Cooling Technologies Inc., Anderson, SC (US)

(72) Inventors: Nan Chen, Templestowe (AU); He Zhao, Flagstaff Hill (AU); Yunshui Chen, San Ramon, CA (US)

(73) Assignee: Advanced Liquid Cooling Technologies Inc., Anderson, SC (US)

( * ) Notice: Subject to any disclaimer, the term of this patent is extended or adjusted under 35 U.S.C. 154(b) by 32 days.

(21) Appl. No.: 17/501,983

(22) Filed: Oct. 14, 2021

(65) Prior Publication Data

US 2022/0412672 A1 Dec. 29, 2022

Related U.S. Application Data

(63) Continuation-in-part of application No. 17/487,000, filed on Sep. 28, 2021, which is a continuation-in-part of application No. 17/360,003, filed on Jun. 28, 2021.

(51) Int. Cl.
*F28F 3/12* (2006.01)
*F28F 3/04* (2006.01)
*H05K 7/20* (2006.01)

(52) U.S. Cl.
CPC .............. *F28F 3/12* (2013.01); *F28F 3/048* (2013.01); *H05K 7/20936* (2013.01)

(58) Field of Classification Search
CPC ...... F28F 3/12; F28F 3/048; F28D 2021/0029; H05K 7/20809
See application file for complete search history.

(56) References Cited

U.S. PATENT DOCUMENTS

| 7,331,380 | B2 * | 2/2008 | Ghosh | H01L 23/473 165/125 |
| 2007/0030655 | A1 * | 2/2007 | Bhatti | H01L 23/4336 257/E23.093 |
| 2017/0303441 | A1 * | 10/2017 | Farshchian | F28F 21/089 |

* cited by examiner

Primary Examiner — Lionel Nouketcha
(74) Attorney, Agent, or Firm — Nutter, McClennen & Fish, LLP

(57) ABSTRACT

A heat sink device including: a cover module having a liquid inlet; a central flow channel for distributing coolant fluid introduced into the liquid inlet of the cover module; a plurality of inner fins; a plurality of inner radial flow channels; wherein coolant fluid from the central flow channel flows into the inner radial flow channels; a ring segment disposed around an outer perimeter of the plurality of inner fins, wherein the ring segment is configured to at least one of, mix and distribute coolant fluid received from the inner radial flow channels; a plurality of outer fins; a plurality of outer radial flow channels; wherein coolant fluid from the ring segment flows into the outer radial flow channels; and an outer flow channel, wherein coolant fluid flowing out of the radial flow channels outlet drains into the outer flow channel.

19 Claims, 7 Drawing Sheets

MICROCHANNEL HEAT SINK CONFIGURATION FOR OPTIMAL DEVICE COOLING

CROSS-REFERENCE TO RELATED APPLICATIONS

The present continuation-in-part patent application claims priority benefit under 35 U.S.C. 120 of the U.S. nonprovisional patent application Ser. No. 17/360,003, "A Reverse-Return Parallel Loop Thermal Management System for an Electronic Device", filed on 28 Jun. 2021, under 35 U.S.C. 111 (a), and U.S. utility patent application Ser. No. 17/487,000, entitled "A Microchannel Heat Sink Device", filed on 28 Sep. 2021 under 35 USC 111(a). The contents of this/these related patent application(s) is/are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to electronic device cooling systems. More particularly, certain embodiments of the invention relate to microchannel configurations of heat sinks for optimal device cooling.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Electronic devices, such as, without limitation, servers, consumer electronics, vehicular devices, etc., may require sufficient cooling systems to perform optimally. As such, heat sinks may be used to remove heat and ensure that an electronic device runs within an allowable temperature range. As technology develops more powerful electrical devices, more efficient cooling systems may be required to improve system performance and increase the overall longevity of electronic devices, as higher performing devices typically output a greater amount of heat.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that conventional heat exchangers may be used to cool electronic devices. For example, without limitation, a jet of cooling fluid may transfer heat away from a heat source, or a device may be coupled to a finned heat sink composed of thermally conductive material. Further, single-phase flow in microchannels may also be used to remove high heat flux. Single-phase flow may require a large amount of pumping power to maintain a temperature gradient within acceptable limits, especially at the higher range of performance. Further, longevity concerns may be considered as water circuits directly within, for example, without limitation, servers and mainframes may not be desirable.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 4A-4B illustrate an exemplary microchannel heat sink, wherein FIG. 4A shows an exploded view of a microchannel heat sink, and FIG. 4B shows a cross-sectional view of a microchannel heat sink, in accordance with an embodiment of the present invention;

FIGS. 5A-5C illustrate a flow pattern of an exemplary heat exchanger, wherein FIG. 5A shows a perspective view of a flow pattern of a heat exchanger, FIG. 5B shows a flow pattern of a first layer of a heat exchanger, and FIG. 5C shows a flow pattern of a second layer of a heat exchanger, in accordance with an embodiment of the present invention.

Figure 1:
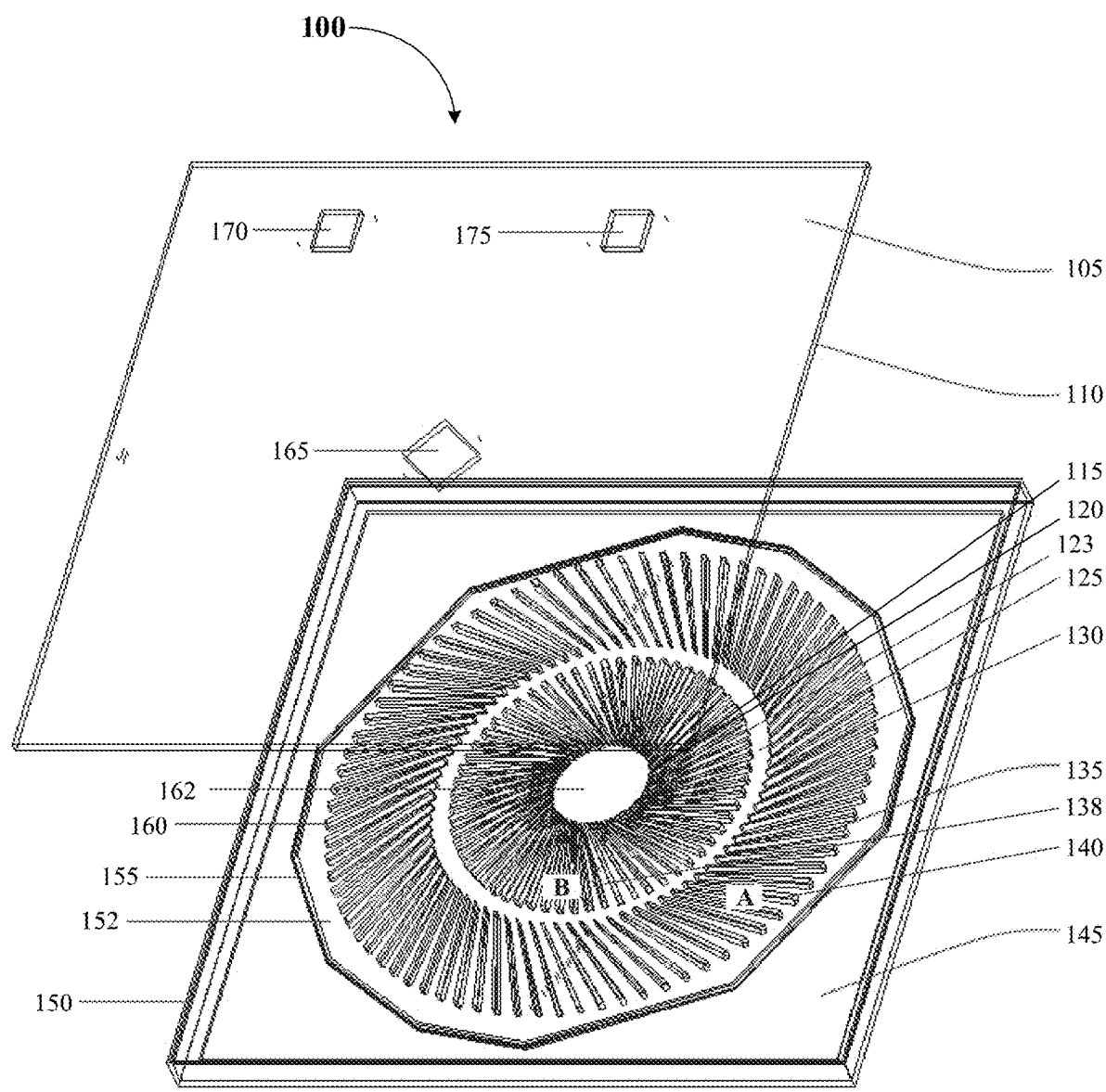
FIG. 1 illustrates an exemplary heat sink with one microchannel layer, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognize in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of them—Such terms are open-ended and mean "including but not limited to". When employed in the appended claims, this term does not foreclose additional structure or steps. Consider a claim that recites: "A memory controller comprising a system cache . . . . " Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Figure 2:
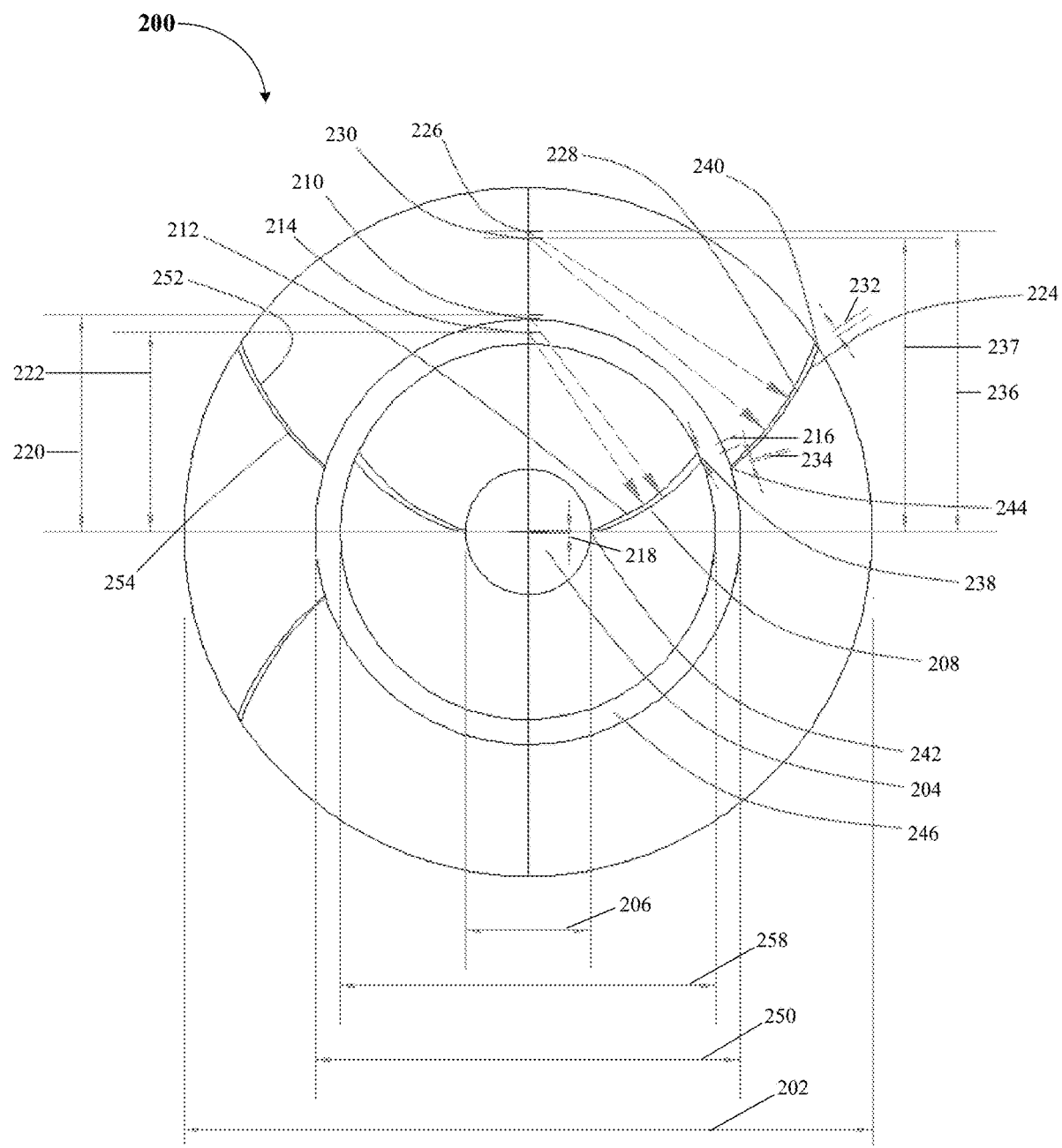
FIG. 2 illustrates an exemplary circular arc form fin profile, in accordance with an embodiment of the present invention.

FIG. 1 illustrates an exemplary heat sink device with one microchannel layer, in accordance with an embodiment of the present invention. In one embodiment, heat sink device 100 may include curved, segmented, diverging, radial microchannels. Microchannels may be formed under certain restrictions of minimal thickness of fins or minimal gap of flow channels. Curved microchannels may increase heat exchanging area and enhance flow turbulence, diverging and segmented channels may mitigate bubble clogging in two-phase flow, and radial microchannels may provide additional heat exchanging area per unit volume, resulting in an overall improved heat sink design. Heat sink device 100 may include microchannel layer 160, base plate 155, base plate flow channel 152, frame 150, cover module 105, central flow channel 162, ring segment 125, outer flow channel 145, circle B radial flow channels 120, plurality of circle A fins 140, plurality of circle B fins 138, liquid inlet 165, first vapor outlet 170, and second vapor outlet 175. Bottom plane 110 of cover module 105 may be combined with top surface 135 of circle A fins 140 to form flow channels 115-130, and 145. Additionally, outer flow channel 145 may be formed from the gap between bottom plane 110 and the plane of flow channel 145. The size of outer flow channel 145 may depend upon, for example, without limitation, return flow distribution. A plurality of radially extending microchannels may be formed between the fins. Ring segment 125 may separate circle A from circle B and may act as a flow channel between the plurality of radially extending flow channels between the plurality of fins of circle A and circle B. Circle B fins 138 may be curved, and the cross-sectional area of circle B radial flow channels inlet 115 may be smaller than that of circle B radial flow channels outlet 123, which may be diverged microchannels. Coolant fluid may be introduced into liquid inlet 165. The coolant fluid may flow from central flow channel 162 and may be evenly distributed into circle B radial flow channels 120 of fins 138. Circle B fins 138 may have curved walls geometrically optimized to reduce pressure drop, enhance heat transfer, and direct the coolant fluid toward flow channel 125 and may be distributed evenly into circle A radial flow channels inlet 130 of circle A fins 140. Circle A fins 140 may be curved, and the cross-sectional area of circle A radial flow channels inlet 130 may be smaller than that of circle B radial flow channels outlet 135, which may be diverged microchannels. Coolant fluid that accumulates in outer flow channel 145 may combine with coolant fluid in base plate flow channel 152 and may be guided towards first vapor outlet 170 and second vapor outlet 175 of cover module 105 FIG. 2 illustrates an exemplary circular arc form fin profile, in accordance with an embodiment of the present invention. In the formation of circular arc form fin profile (CAFFP) 200, outer diameter 202 must be determined depending on the geometrical limits of the specific application to which CAFFP 200 may be applied. The geometrical dimensions including outer diameter 202, outer microchannel diameter 250, inner microchannel diameter 258 and inner diameter 206 may be determined by the heat load to be rejected and the permitted pressure drop through the microchannel. The procedures to determine the geometrical dimensions may be the iterated processes including In a Step 1: define a series of preliminary dimensions. In Step 2: generate the 3d model. In Step 3: apply the CFD analysis. And, in Step 4: modify the geometrical dimension. If the heat load is high and size of heat source is big, outer diameter 202 may be bigger. In an embodiment, a suitable approximate range of dimensions may include about 55 mm for outer diameter 202, about 34 mm for outer microchannel diameter 250, about 30 mm for inner microchannel diameter 258, about 10 mm for inner diameter 206, and about 0.28 mm for second inner fin width 218. CAFFP 200 may include inner fins 238 with inner inlet side 242, outer fins 240 with outer inlet side 244, and ring segment 246 between inner fins 238 and outer fins 240. Additionally, the microchannels may have inner microchannel diameter 258 and outer microchannel diameter 250. The volume of central inlet plenum 204 (formed from an L1 central flow channel and an L2 central flow channel) may likewise be system specific, and may depend on the trade-off between even distribution of mass flow into each microchannel, wherein lower velocity may be more beneficial, and impingement, wherein higher velocity may be more beneficial. Once outer diameter 202 inner diameter 206 have been determined based on system specifications, the number of segments may be decided upon to avoid instability of two-phase flow. In the present embodiment, two segments are utilized, but as will be appreciated by one skilled in the art, a greater or fewer number of segments may be used. Additionally, the width between the segments may also be variable, and such parameters may be determined based on simulation analysis of the specific system.

First inner fin arc 208 may be a portion of a first circle with first inner center position 210, while second inner fin arc 212 may be a portion of a second circle with second inner center position 214. In the present embodiment, first inner fin arc 208 and second inner fin arc 212 may be eccentric and have different diameters, resulting in differences between first inner fin width 216 and second inner fin width 218. However, first inner fin arc 208 and second inner fin arc 212 may be eccentric with the same diameter, resulting in the same first inner fin width 216 and second inner fin width 218. With first inner fin arc 208 and second inner fin arc 212 having the same diameter, the differences between the inner fins 238 may depend on the difference between first inner radius 220 and second inner radius 222 and the diameters of first inner fin arc 208 and second inner fin arc 212. Once the profiles of the fins are formed, the microchannels may be formed from the grooves between the fins. Significantly, the divergent degree of the microchannels may depend on the difference between first inner center position 210 and second inner center position 214.

First outer fin arc 224 may be a portion of a first circle with first outer center position 226, while second outer fin arc 228 may be a portion of a second circle with second outer center position 230. In the present embodiment, first outer fin arc 224 and second outer fin arc 228 may be eccentric and have different diameters, resulting in differences between first outer fin width 232 and second outer fin width 234. However, first outer fin arc 224 and second outer fin arc 228 may be eccentric with the same diameter, resulting in the same first outer fin width 232 and second outer fin width 234. With first outer fin arc 224 and second outer fin arc 228 having the same diameter, the differences between the outer fins 240 may depend on the difference between first outer radius 236 and second outer radius 237 and the diameters of first outer fin arc 224 and second outer fin arc 228. Once the profiles of the fins are formed, the microchannels may be formed from the grooves between the fins. Significantly, the divergent degree of the microchannels may depend on the difference between first outer center position 226 and second outer center position 230.

First inner fin arc 208, second inner fin arc 212, first outer fin arc 224, and second outer fin arc 228 may be positioned such that there is an offset angle between second inner fin arc 212 and first inner fin arc 208, and an offset angle between second outer fin arc 228 and first outer fin arc 224. The offset angles may cause out flow channels in the first circle to hit the ends of the fins of the second circle of the heat exchanger, which may enhance heat transfer and mixing capabilities by physically stirring the flow of coolant, at the expense of a higher pressure drop. Additionally, the bending direction of first inner fin arc 208 and second inner fin arc 212 may be counterclockwise, which may be the same bending direction of first outer fin arc 224 and second outer fin arc 228. The bending direction of first inner fin arc 208 and second inner fin arc 212 may also be different than the bending direction of first outer fin arc 224 and second outer fin arc 228, as shown with first opposite outer fin arc 252 and second opposite outer fin arc 254. An opposite bending direction may enhance heat transfer capabilities by creating additional vortex in the channels.

Coolant flow may also be enhanced by altering the fan arc configurations. For example, without limitation, the first and second outer circles dictating the shape of first outer fin arc 224 and second outer fin arc 228, respectively, may be reduced to coincide with the first and second inner circles dictating the shape of first inner fin arc 208 and second inner fin arc 212. That is, first inner radius 220 may be equal to first outer radius 236, with first inner center position 210 coinciding with first outer center position 226. Similarly, second inner radius 222 may be equal to second outer radius 238, with second inner center position 214 coinciding with second outer center position 230. Such a configuration may cause fluid from the out-flow channels to directly flow into in flow channels.

Depending on the manufacturing process for the fins, a lower limit to first inner fin width 216, second inner fin width 218, first outer fin width 232, and second outer fin width 234 may be found. While smaller and thinner fins may increase the heat exchanging area and allow for a larger flow cross section, the overall design must be practical when considering reasonable manufacturing costs and end-product quality, regardless of whether the fins are manufactured using additive or subtractive manufacturing.

Figure 3:
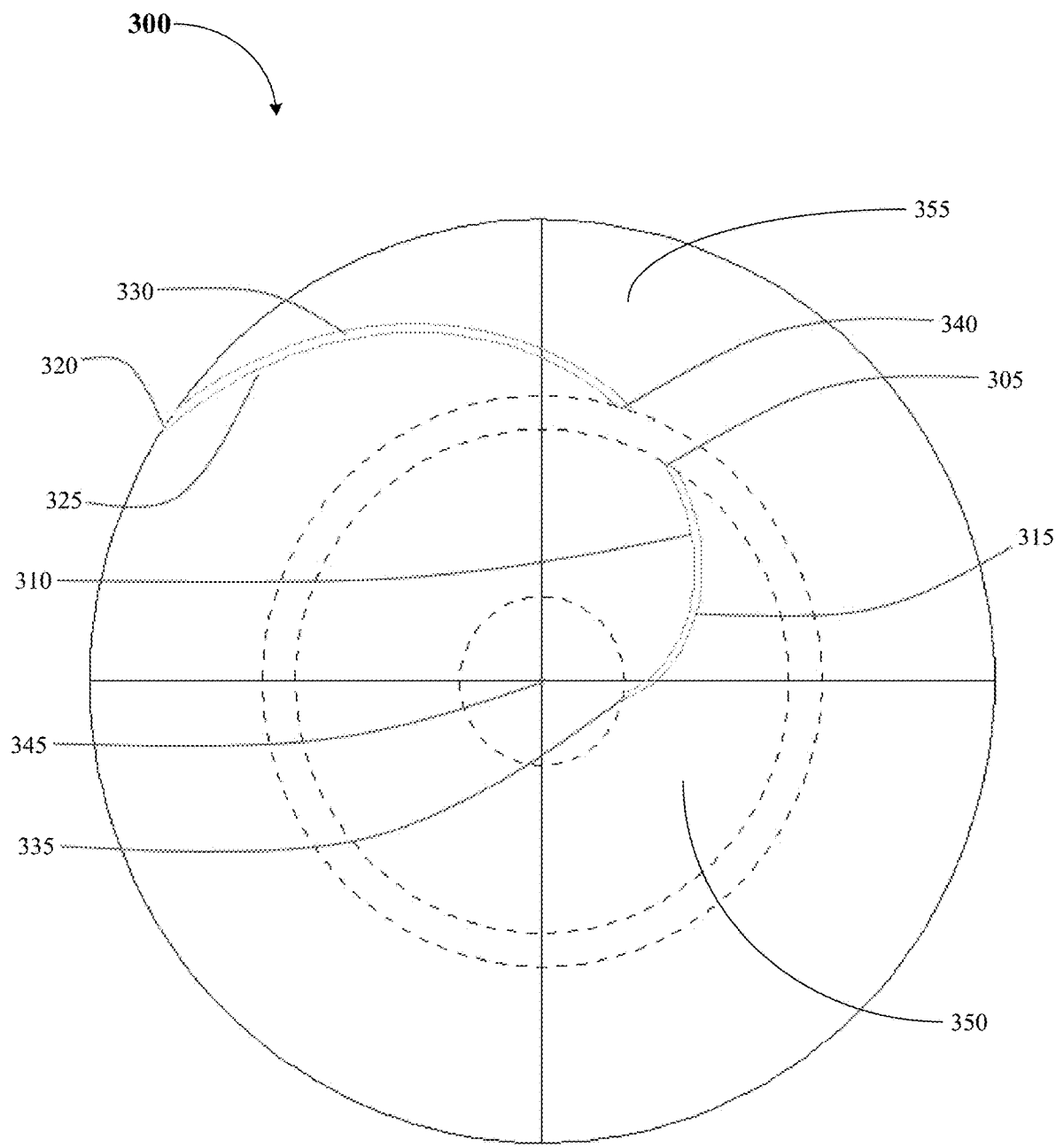
FIG. 3 illustrates an exemplary involute arc form fin profile, in accordance with an embodiment of the present invention.

FIG. 3 illustrates an exemplary involute arc form fin profile, in accordance with an embodiment of the present invention. Involute calculations may also be used in the configuration of involute arc form fin profile (IAFFP) 300. IAFFP may include inner fin 305 with inner inner-fin wall 310 and outer inner-fin wall 315, outer fin 320 with inner outer-fin wall 325 and outer outer-fin wall 330, and inner-fin inlet 335 and outer-fin inlet 340. The following equations may be used to calculate involutes used for IAFFP 300:

$$x=r(\cos t + t \sin t), y=r(\sin t - t \cos t); \quad (1)$$

$$x=r(\cos(t-\alpha)+t \sin(t-\alpha)), y=r(\sin(t-\alpha)-t \cos(t-\alpha)); \quad (2)$$

$$L=(r/2)t^2; \quad (3)$$

$$T=R_{ce}-R_{ci}, \quad (4)$$

wherein r may be the radius of the circle, t may be the parameter of angle in radian, α may be the start angle, L may be the length of the arc of the involute of the circle, $R_{ce}$ may be the external involute radius of curvature, and $R_{ci}$ may be the internal involute radius of curvature. By adjusting the parameters of the above equations, involutes with different geometries may be achieved. Inner inner-fin wall 310 and inner outer-fin wall 325 may be on a first involute defined by (1), while outer inner-fin wall 315 and outer outer-fin wall 330 may be on a second involute defined by (2). The fin length may then be calculated using (3), and the thickness of the fin may be calculated using (4).

With reference to FIG. 2 and FIG. 3, outer inner-fin arc 315 and outer outer-fin arc 330 may be a portion of the involute with center 345. Outer inner-fin arc 315 may be the portion of the involute within inner region 350, while outer outer-fin arc 330 may be the portion of the involute within outer region 355. In contrast, inner inner-fin arc 310 and inner outer-fin arc 325 may be a portion of the involute with center 345 with a different starting angle, calculated with (2). Inner inner-fin arc 310 may be the portion of the involute within inner region 350, while inner outer-fin arc 325 may be the portion of the involute within outer region 355. Fin thickness may be calculated using (4), and may be determined by the starting angle such that a constant fin thickness configuration may be achieved. The corresponding channel between two adjacent fins may diverge naturally due to an increase in circumferential arc length. Variation in fin thickness may also be realized by using different diameters for the involute with center 345.

Because outer inner-fin arc 315 and outer outer-fin arc 330 may be formed from the same involute, and inner inner-fin arc 310 and inner outer-fin arc 325 may be formed from the same involute, the fluid from outlet radial flow channels may flow directly into inlet radial flow channels along a tangential arc direction. Additionally, by adopting different involute diameters, outer inner-fin arc 315 and outer outer-fin arc 330 may be formed from different involutes entirely, and similarly for inner inner-fin arc 310 and inner outer-fin arc 325. Such a variation in involute diameter may result in a configuration with optimized heat transfer capabilities.

While FIG. 2 and FIG. 3 illustrated fin configurations for one or single layer of a heat sink, it should be appreciated by one skilled in the art that CAFFP 200 and IAFFP 300 may be applied to multiple layers, such as, without limitation, two, three, etc. layers. Further, the fin layout of FIG. 2 may be used for the first layer and the fin layer of FIG. 3 may be used for the second layer and vice versa. While possible, greater than three layers may not be recommended as the relationship between layer and heat rejection capabilities may not be linear. Diminishing marginal utility by increasing the area against heat rejection may be observed. Additionally, the vapor outlets on cover 105 may be adjusted in size, shape, and location depending on the needs of a specific system. Variations of the aforementioned configurations may also include, for example, without limitation, fins of different length, fins of different geometrical profiles, etc. An optimal configuration for a specific system may be determined through systemic simulation, and may differ system to system. The parameters of the designs in FIG. 2 and FIG. 3 may depend on the heat load, type of working fluid, flow of fluid, dimension restrictions of heat sources, etc. In an embodiment, the design may include an iterated process including a Step 1: 3D model auto generation by the geometrical formulas; Step 2: CFD analysis; and Step 3: adjusting the geometrical parameters for better performance.

The formation of fin curves may include a large amount of variations in design. The aforementioned fin configurations as shown in FIG. 2 and FIG. 3 may detail examples of geometrical fin profiles. However, as will be appreciated by one skilled in the art, the fin configurations of the present embodiment may not be limited to the aforementioned designs. While manufacturing and quality control of heat sinks may benefit from geometrical fin profiles, alternative fin configurations may also be implemented, such as, without limitation, non-geometrical fin configurations. Additionally, combination of various elements of the aforementioned fin configurations may be mixed and matched depending on the needs of the electronic device to be cooled. For example, without limitation, uneven fin thickness, additional segments, diverging microchannels between fins, offset outlets between circles, opposite bending directions, etc. In general, a heat sink in the current embodiment may include curved, segmented, diverging, radial microchannels. Curved microchannels may increase heat exchanging area and enhance flow turbulence, diverging and segmented channels may mitigate bubble clogging in two-phase flow, and radial microchannels may provide additional heat exchanging area per unit volume, resulting in an overall improved heat sink design.

Figure 4A:
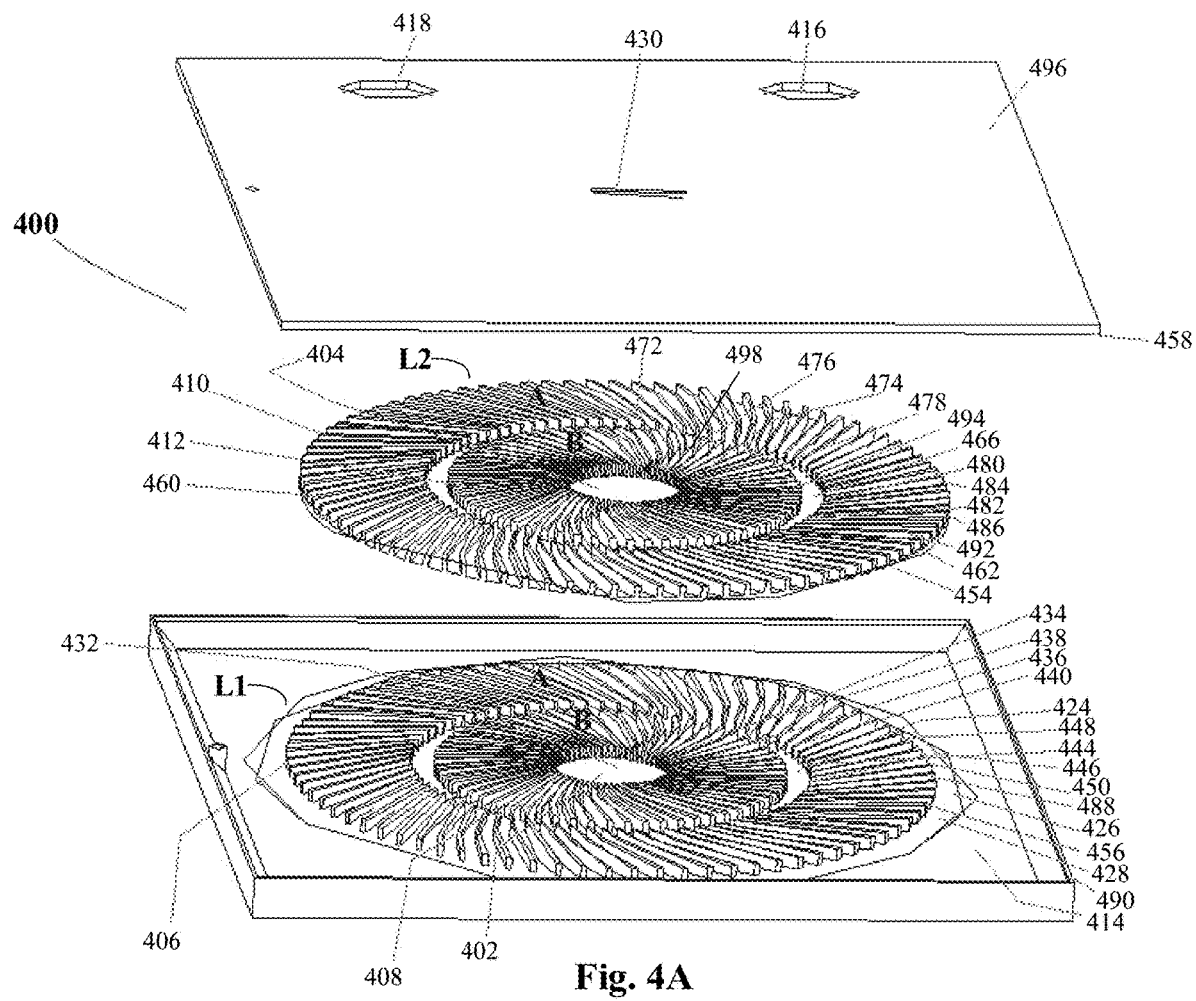
Figure 4B:
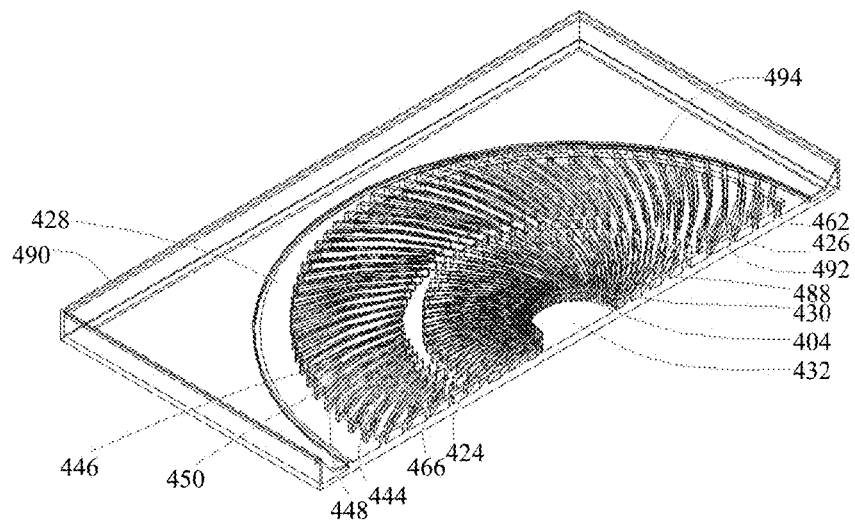

FIGS. 4A-4B illustrate an exemplary microchannel heat sink, wherein FIG. 4A shows an exploded view of a microchannel heat sink, and FIG. 4B shows a cross-sectional view of a microchannel heat sink, in accordance with an embodiment of the present invention. Microchannel heat sink 400 may include a central inlet plenum formed from L1 central flow channel 402 and L2 central flow channel 404, layers including radial microchannels, and a circumferential outlet chamber. The central inlet plenum may include an impingement region and may connect with the microchannel layers that include microchannels radially extending from the impingement region. Coolant fluid may impinge the bottom of the inlet plenum and subsequently flow through the radially extending microchannels toward the perimeter of each layer. The second layer may be arranged in a staggered angle to the first layer. A fluid outlet may be joined with the second layer. Additional microchannel layers may be included depending on the heat load. Microchannel heat sink 400 may be incorporated into a power electronics module having a power electronics device. The microchannels may be circumferentially distributed, and the profiles of the microchannels in each layer may be curved. The cross-sectional area of the microchannels may diverge radially, and each microchannel may be segmented. The discontinue part of each microchannel may form an intermediate ring.

Microchannel heat sink 400 may comprise liquid inlet 430, L1 central flow channel 402, L2 central flow channel 404, L1 circle A fins 406, L1 circle B fins 408, L2 circle A fins 410, L2 circle B fins 412, flow channel 414, first vapor outlet 416, and second vapor outlet 418. L1 may refer to the first layer, L2 may refer to the second layer, circle A may refer to the outer ring, and circle B may refer to the inner ring. As will be described in greater detail below, the coolant fluid may be introduced into microchannel heat sink 400 to reduce the operating temperature of a power electronics device. Liquid inlet 430 may be in a variety of different configurations, and is not limited to the configuration shown in FIG. 4A. For example, without limitation, liquid inlet 430 may be configured as an orifice, slot, matrix of orifices and/or slots, bel mouth, nozzle, sprayer, etc. to form different types of flow patterns. The configuration of liquid inlet 430 may be integrated with a type of adjustable valve mechanism driven by actuators, by which flow through liquid inlet 430 may be controlled. Liquid inlet 430 may be a separate component from the second layer of microchannel heat sink 400 and may be a mountable component for ease of machining if in, for example, without limitation, a bell mouth configuration. Liquid inlet 430 may be composed of thermally conductive material, such as, without limitation, aluminum, copper, etc. to aid in transfer of thermal energy. Coolant fluid may be introduced into liquid inlet 430. A coolant fluid line may be fluidly coupled to liquid inlet 430 via fluid couplings to provide coolant fluid to the inlet jet. The coolant fluid line may be connected to a coolant fluid source with fluid pumps. The coolant fluid may be any type of fluid used for heat exchanging applications, such as, but not limited to, refrigerant, water, etc.

The first layer may comprise L1 central flow channel 402, L1 circle A fins 406, L1 circle B fins 408, L1 ring segment 424, L1 base plate 426, L1 circle A flow channel 428, and flow channel 414. A plurality of radially extending microchannels may be formed between the fins. Coolant fluid flow from L1 central flow channel 402 may impinge onto the surface 432 of L1 central flow channel 402, by which the advantages of impingement, such as, without limitation, efficient use of fluid and high transfer rates, may be used to carry heat away. Subcooled liquid may be recommended for two-phase fluid to impinge. Because of the large volume of L1 central flow channel 402, fluid may be distributed evenly into L1 circle B radial flow channels inlet 434 formed from L1 circle B inlet side radial fins 436 of two adjacent fins of L1 circle B fins 408. L1 circle B radial flow channels inlet 434 may be evenly located circumferentially around L1 central flow channel 402. L1 central flow channel 402 and L2 central flow channel 404 may form the inlet plenum, in with liquid impingement and distribution may occur. After impinging surface 432 of L1 central flow channel 402, coolant fluid may flow outwardly through L1 circle B radial flow channels inlet 434 towards L1 circle B radial flow channels outlet 438. L1 circle B radial flow channels outlet 438 may be formed from L1 circle B radial fins outlet side 440 of L1 circle B fins 408. L1 circle B fins 408 may be curved, and the cross-sectional area of L1 circle B radial flow channels inlet 434 may be smaller than that of L1 circle B radial flow channels outlet 438, which may be diverged microchannels. The diverging channels may match the column expansion caused by the emergence of bubbling of the evaporation process and result in more stable flow with a smaller pressure drop. L1 circle B fins 408 may have curved walls geometrically optimized to reduce pressure drop, enhance heat transfer, and direct coolant fluid toward the perimeter of L1 circle B 442. The term optimized as used herein may mean that the geometrical configuration of the features and resulting microchannels may be designed to enhance fluid flow, reduce pressure drop, and increase heat transfer to the coolant fluid. As such, the microchannels may not simply be channels formed by a circle, but also may be formed by involutes or splines, and the features defining the microchannels may include curved walls, a diverging cross-section, and may vary in size and shape. By selecting the geometrical configuration of L1 circle B fins 408, coolant fluid may more efficiently flow within the microchannels.

L1 circle B fins 408 and L1 circle A fins 406 may be intermittent, and the annular volume may be L1 ring segment 424. Coolant fluid from L1 circle B radial flow channels outlet 438 may flow into L1 ring segment 424, in which good mixture, rebalancing, and expansion may occur. As a result, a more stable and efficient two-phase heat transfer may be achieved.

Coolant fluid from L1 ring segment 424 may flow into L1 circle A radial flow channels inlet 444 formed from L1 circle A radial fins inlet side 446 of L1 circle A fins 406. L1 circle A radial flow channels inlet 444 may be evenly located circumferentially around L1 ring segment 424. Coolant fluid may flow outwardly though L1 circle A radial flow channels inlet 444 toward L1 circle A radial flow channels outlet 448. L1 circle A radial flow channels outlet 448 may be formed from L1 circle A radial fins outlet side 450. Of L1 circle A fins 406. L1 circle A fins 406 may be curved, and the cross-sectional area of L1 circle A radial flow channels inlet 444 may be smaller than that of L1 circle A radial flow channels outlet 448, which may be diverged microchannels. These diverging channels may match the volume expansion caused by the emergence of bubbling in the evaporation process and result in a more stable flow and smaller pressure drop. L1 circle A fins 406 may be geometrically optimized to reduce pressure drop, enhance heat transfer, and direct coolant fluid toward the perimeter of L1 circle A 452. By selecting the geometrical configuration (i.e. size and position) of L1 circle A fins 406, the coolant fluid may more efficiently flow within the microchannels.

L2 bottom surface 454 may be brazed or machined as a single part with L1 fins top surface 456. L1 base plate 426, the walls of L1 circle B fins 408 and L1 circle A fins 406, and L2 bottom surface 454 may form the microchannel flow paths of the first layer. Cover bottom surface 458 may be brazed or machined as a single part with the L2 fins top surface 460. L2 base plate 462, the walls of L2 circle B fins 412 and L2 circle A fins 410, and L2 bottom surface 454 may form the microchannel flow paths of second layer 464.

Second layer 464 may comprise L2 central flow channel 404, L2 circle A fins 410, L2 circle B fins 412, L2 ring segment 466, and L2 base plate 462. L2 circle A 468 may refer to the outer ring of fins in second layer 464, while L2 circle B 470 may refer to the inner ring of fins in second layer 464. A plurality of radially extending microchannels may be formed between the fins. Coolant fluid may flow from L2 central flow channel 404 and may be distributed evenly into L2 circle B radial flow channels inlet 472 formed from L2 circle B radial fins inlet side 474 of L2 circle B fins 412 due to the large volume of L2 central flow channel 404. L2 circle B radial flow channels inlet 472 may be evenly located circumferentially around L2 central flow channel 404. Coolant fluid may flow outwardly through L2 circle B radial flow channels inlet 472 toward L2 circle B radial flow channels outlet 476. L2 circle B radial flow channels outlet 476 may be formed from L2 circle B radial fins outlet side 478 of L2 circle B fins 412. L2 circle B fins 412 may be curved, and the cross-sectional area of L2 circle B radial flow channels inlet 472 may be smaller than that of L2 circle B radial flow channels outlet 476, which may be diverged microchannels. These diverging channels may match volume expansion caused by the emergence of bubbling in the evaporation process and result in a stable flow and smaller pressure drop. L2 circle B fins 412 may have curved walls and may be geometrically optimized to reduce pressure drop, enhance heat transfer, and direct coolant fluid toward the perimeter of L2 circle B 470. By selecting a geometrical configuration (i.e. size and position) for L2 circle B fins 412, coolant fluid may more efficiently flow within the microchannels.

L2 circle B fins 412 and L2 circle A fins 410 may be intermittent, and the annular volume may be called L2 ring segment 466. Coolant fluid from L2 circle B radial flow channels outlet 472 may flow into L2 ring segment 466, in which good mixture, rebalancing, and expansion may occur. As a result, a much more stable and efficient two-phase heat transfer may be achieved.

Coolant fluid from L2 ring segment 466 may flow into L2 circle A radial flow channels inlet 480 formed from L2 circle A radial fins inlet side 482 of L2 circle A fins 410. L2 circle A radial flow channels inlet 480 may be evenly located circumferentially around L2 ring segment 466. Coolant fluid may flow outwardly though L2 circle A radial flow channels inlet 480 toward L2 circle A radial flow channels outlet 484. L2 circle A radial flow channels outlet 484 may be formed by L2 circle A radial fins outlet side 486 of L2 circle A fins 410. L2 circle A fins 410 may be curved, and the cross-sectional area of L2 circle A radial flow channels inlet 480 may be smaller than that of L2 circle A radial flow channels outlet 484, which may be diverged microchannels. These diverging channels may match volume expansion caused by the emergence of bubbling in the evaporation process and result in a much more stable flow with a smaller pressure drop. L2 circle A fins 410 may have curved walls and may be geometrically optimized to reduce pressure drop, enhance heat transfer, and direct coolant fluid toward the perimeter of L2 circle A 468. By selecting a geometrical configuration (i.e. size and position) for L2 circle A fins 410, coolant fluid may more efficiently flow within the microchannels.

Figure 5A:
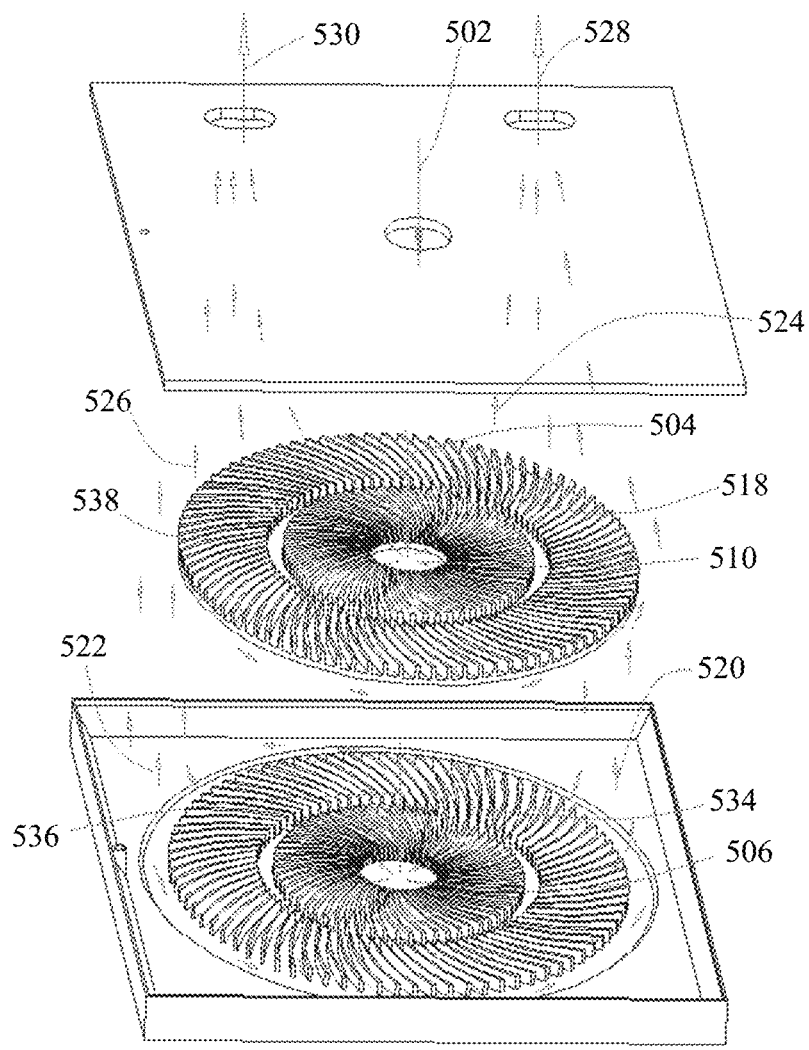
Figure 5B:
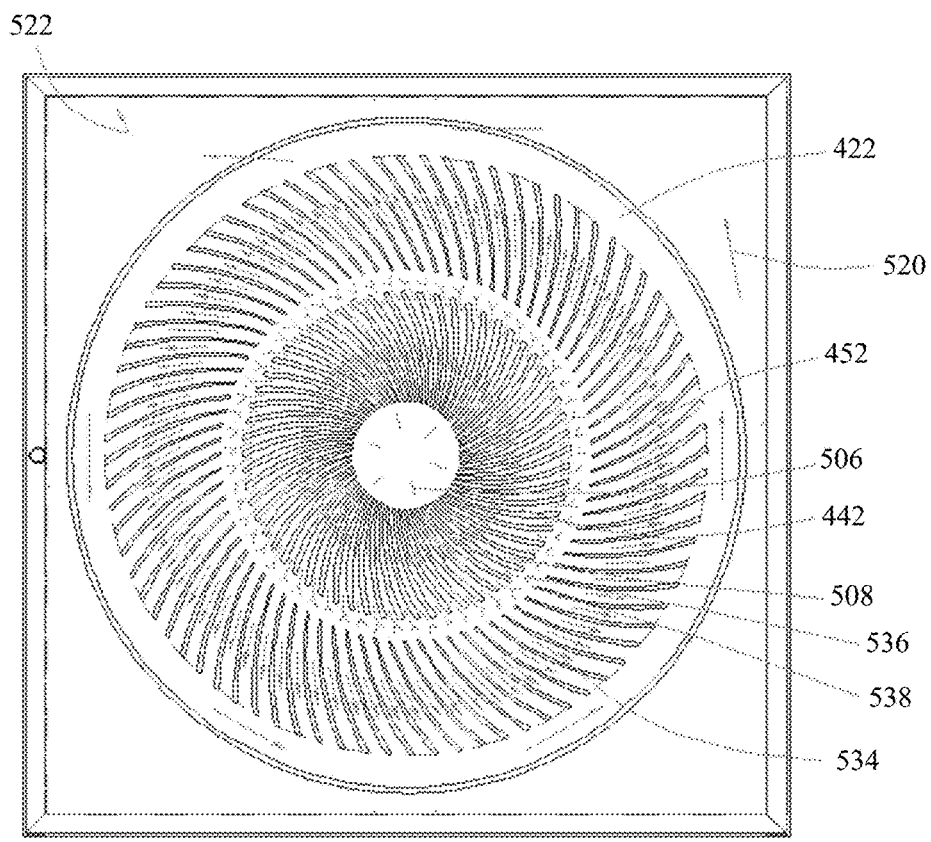
Figure 5C:
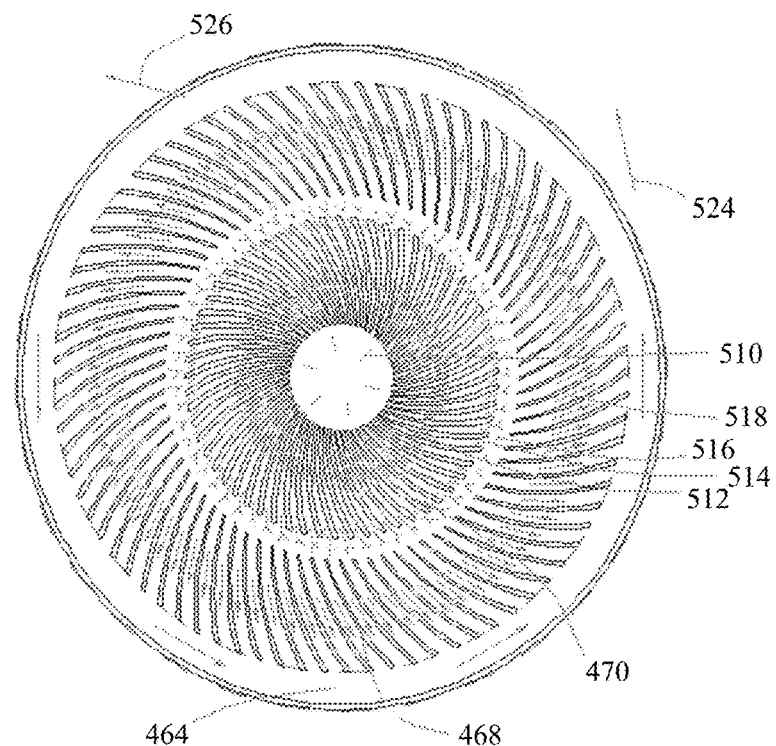

FIGS. 5A-5C illustrate a flow pattern of an exemplary heat exchanger, wherein FIG. 5A shows a perspective view of a flow pattern of a heat exchanger, FIG. 5B shows a flow pattern of a first layer of a heat exchanger, and FIG. 5C shows a flow pattern of a second layer of a heat exchanger, in accordance with an embodiment of the present invention. With reference to FIGS. 4A-4B and FIGS. 5A-5C, fluid 502 may flow into the inlet plenum formed from L1 central flow channel 402 and L2 central flow channel 404 through liquid inlet 430. Inside the inlet plenum, fluid 502 may flow downward in direction 504, and may be divided into first branch 504 to the second layer and in direction 536 through directions 506 to the first layer. Due to the large size of the inlet plenum, fluid 502 may flow in outward directions 506 and distributed to L1 circle B radial flow channel inlet 434, and flow along directions 508. Once fluid 502 exits L2 circle B radial flow channel outlet 438, fluid 502 may join together and be mixed in L1 ring segment 424 and be balanced and redistributed into L1 circle A radial flow channel inlet 444 in direction 536 and direction 538. Fluid 502 may flow in L2 circle A radial flow channels 492 in direction 534, which may be diverging and curved channels.

Fluid 502 may flow in direction 510 to be evenly distributed into L2 circle B radial flow channels inlet 472 and flow along the microchannel in direction 512 and direction 538. Once fluid 502 flows out of L2 circle B radial flow channels outlet 476, fluid 502 may be mixed together in L2 ring segment 466 and be balanced and redistributed into L2 circle A radial flow channels inlet 480 in direction 514 and direction 516. Fluid 502 may flow in L2 circle A radial flow channels 492 in direction 518, which may be diverging and curved channels. Fluid 502 from L1 circle A radial flow channels outlet 448 and L2 circle A radial flow channels outlet 484 may join together in flow channel 414 and guided to first vapor outlet 416 and second vapor outlet 418 on cover 496. L1 circle A flow channel 428 may share volume with L1 circle A radial flow channel 448, and thus fluid 502 may collect in the shared volume. L1 circle A flow channel 428 may be a part of the volume of flow channels 414, which may be the chamber located between the top surface of L1 base plate 426 and the bottom surface of cover 496. The volume of flow channels 414 may be large enough to achieve a similar outlet static pressure within each microchannel, including L2 circle A radial flow channels 492 and L1 circle A radial flow channels 428. The flow out of L1 circle A flow channel 434 in directions 520 and 522 may join together with the flow out of L2 circle A flow channel 492 in directions 524 and 526, flow upward through first vapor outlet 416 and second vapor outlet 418 of in directions 528 and 530, respectively.

Curved and diverged channels may increase the surface area in which coolant fluid makes contact with walls, and may increase thermal transfer from L1 base plate 426, L1 circle B fins 408, and L1 circle A fins 406 to the coolant fluid. Similarly, curved and diverged channels may be applied to the second layer as well. The geometric configuration of L1 circle B fins 408 and resulting L1 circle B flow channel 498 positioned there between may be determined by computer simulation, for example. The geometric configuration utilized for L1 circle B flow channel 498 may depend on parameters such as, without limitation, flow resistance, type of coolant fluid, and the desired maximum operating temperature of the power electronics device. Similarly, flow simulation may be used to determine the geometry and the layout of all microchannels. The formation of L1 circle B fins 408 and L1 circle A fins 406 may use different strategies, however. For example, without limitation, the thickness of L1 circle B fins 408 may be constant while the thickness of L1 circle A fins 406 may be variable. Additionally, the curvature of L1 circle B fins 408 and L1 circle A fins 406 may be different. Further, the curvature of one side of the fins may be different from the opposite side, by which variable cross-section may be achieved. The aforementioned design variations may be applied independently to all fins in the present embodiment. Detailed simulation may be used for unfamiliar design variations. The project lines of L2 circle A fins 410 and L2 circle B fins 412 may not necessarily be aligned with the profiles of L1 circle A fins 406 and L1 circle B fins 408. As such, L2 circle A fins 410 and L2 circle B fins 412 of second layer 464 may be rotated by a certain degree coaxially with the central axis of L1 circle A fins 406 and L1 circle B fins 408. If microchannel heat sink 400 has more than two layers, this may also be applied to the additional layers. The offset angle may provide better thermal performance because the hot area in the lower microchannels may contact the corresponding cold area in the upper microchannels, and may result in an even temperature distribution. First vapor outlet 416 and second vapor outlet 418 may be an example of one vapor outlet design. Many alternative outlet designs may also be used, such as, but not limited to, slots, orifices, oval slits, louvers, etc.

Microchannel heat sink 400, including frame 490, L1 base plate 426, L2 base plate 462, cover 496, first layer L1, and second layer L2 may be made of a thermally conductive material that may allow for the transfer of thermal energy from microchannel heat sink 400 to the coolant fluid. Thermally conductive materials may include, for example, without limitation, copper, aluminum, thermally enhanced composite materials, polymer composite materials, etc. The microchannels and corresponding components may be formed using, for example, without limitation, a molding process, 3D printing, a machining process, etc. to achieve the desired shape and configuration.

Microchannel heat sink 400 may be used to remove heat flux generated by processors and power electronics devices. The process may be, for example, without limitation, CPUs, GPUs, TPUs, etc. The power electronics devices may be, for example, without limitation, IGBTs, RIGBTs. MOFSETs, power MOFSETs, diodes, transistors, and any combination thereof. For example, without limitation, the development of AI technologies may drive high-performance processors to higher integrations and speed, while servers may involve more processors for each unit to achieve an enhanced calculation capability. Additionally, power electronics devices or devices in a vehicular electrical system, such as, but not limited to, hybrid-electric or electric vehicles. Such power electronics devices may generate significant heat flux when propelling a vehicle. As will be understood by one skilled in the art, the microchannel heat exchangers described herein may also be utilized in other applications, and may not be limited to computation and vehicular applications.

Figure 6:
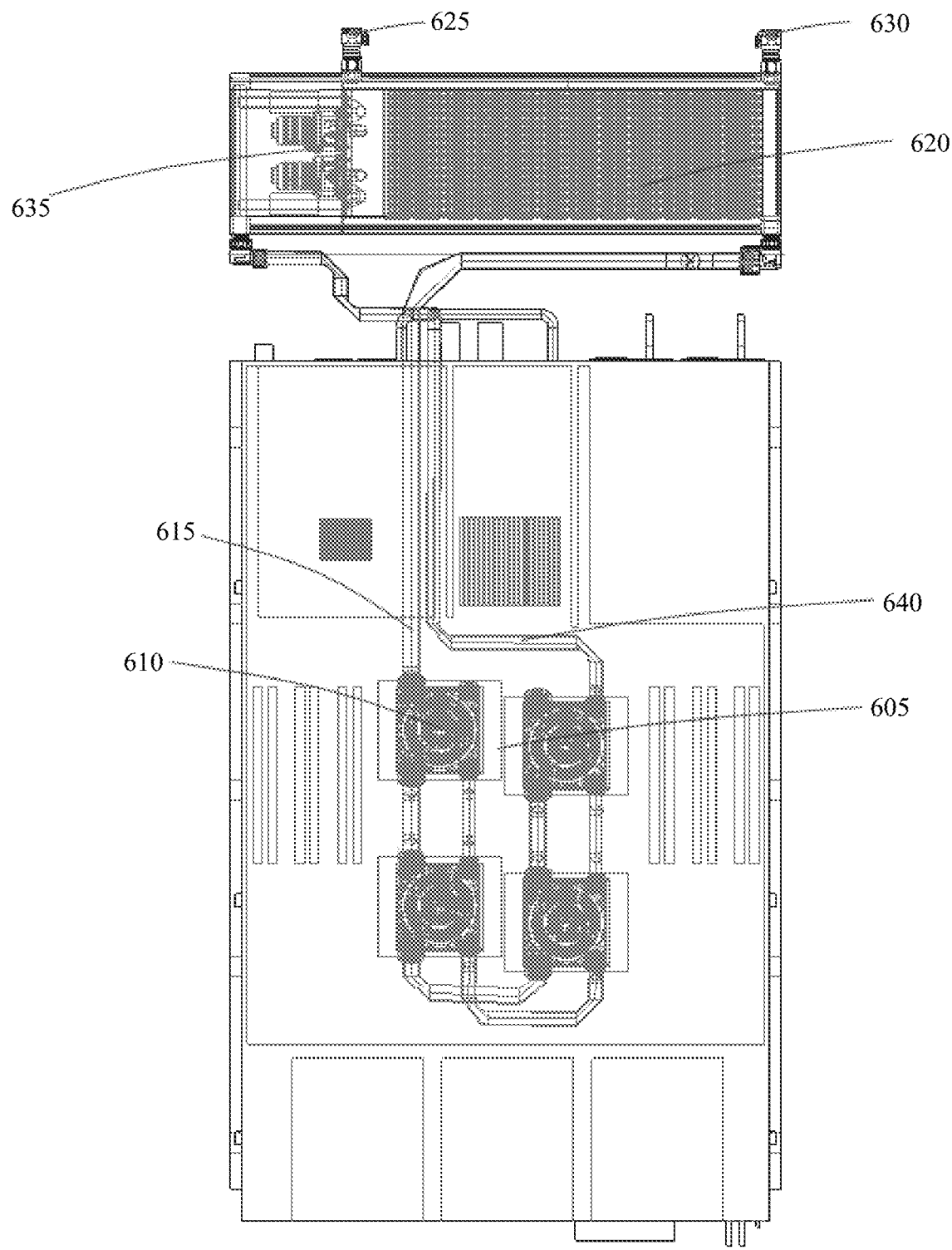
FIG. 6 illustrates an exemplary microchannel heat sink integrated within a server, in accordance with an embodiment of the present invention.

FIG. 6 illustrates an exemplary microchannel heat sink integrated within a server, in accordance with an embodiment of the present invention. Heat flux generated by heat sources 605 may be transferred to microchannel heat sinks 610 through the first layer and the second layer. Each microchannel heat sinks 610 may be tightly mounted to heat sources 605, and the center of each microchannel heat sink 610 may be centered on a local hot spot of each heat source 605 such that the local area may receive a majority of coolant fluid. The cold liquid may be pumped into microchannel heat sink 605 through liquid supply hose 615 and, after absorbing thermal energy from heat sources 605, may be pumped to heat exchanger 620. Heat in heat exchanger 620 may be dissipated using a fluid circulated from coolant inlet 625 to coolant outlet 630 using pump 635, and vapor may return through vapor return hose 640.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed.

Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing microchannel configurations according to the present invention will be apparent to those skilled in the art. Various aspects of the invention have been described above by way of illustration, and the specific embodiments disclosed are not intended to limit the invention to the particular forms disclosed. The particular implementation of the microchannel configurations may vary depending upon the particular context or application. By way of example, and not limitation, the microchannel configurations described in the foregoing were principally directed to electronic device cooling implementations; however, similar techniques may instead be applied to the cooling of variable speed drivers, communication devices, byte coin mining equipment, laser/optical devices, electromagnetic wave generators, etc., which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A device comprising:
    a cover module, said cover module comprising a liquid inlet;
    a central flow channel in fluid communication with the liquid inlet;
    a first plurality of curved fins comprising a plurality of inner curved fins;
    wherein the plurality of inner curved fins comprise a first bending direction;
    a plurality of inner radial flow channels formed between said plurality of inner curved fins;
    wherein the central flow channel is in fluid communication with the plurality of inner radial flow channels
    a ring segment disposed around an outer perimeter of said plurality of inner curved fins;
    a second plurality of curved fins, said second plurality of curved fins comprise outer curved fins;
    wherein said outer curved fins comprise a second bending direction, the second bending direction of the curved outer fins being different from the first bending direction of the curved inner fins;
    a plurality of outer radial flow channels formed between said plurality of outer curved fins;
    wherein the ring segment is in fluid communication with the plurality of outer radial flow channels;
    an outer flow channel in fluid communication with the outer radial flow channels.

2. The device of claim 1, further comprising a plurality of radial flow channels inlet.

3. The device of claim 2, further comprising a plurality of radial flow channels outlet.

4. The device of claim 3, wherein said radial flow channels outlet has a larger cross-sectional area than said radial flow channels inlet, and wherein a difference between the cross-sectional area of the radial flow channels inlet and the radial flow channels outlet is configured to make said plurality of radial flow channels divergent.

5. The device of claim 4, wherein said plurality of inner curved fins and plurality of outer curved fins comprise curved fin walls;
    wherein said first bending direction comprise a clockwise direction; and
    wherein said second bending direction comprise a counterclockwise direction.

6. The device of claim 1, further comprising an outer radial flow channels inlet.

7. The device of claim 6, further comprising an outer radial flow channels outlet.

8. The device of claim 1, wherein said first plurality of curved fins and second plurality of curved fins comprise a first layer of thermally conductive material for the transfer of thermal energy from the curved fins to coolant fluid.

9. The device of claim 8, further comprising a base plate flow channel, wherein coolant fluid draining out of said plurality of outer radial flow channels outlet flows into said base plate flow channel.

10. The device of claim 9, further comprising:
    a first vapor outlet, wherein coolant fluid in the outer flow channel and coolant fluid in the base plate flow channel is guided towards said first vapor outlet; and
    a second vapor outlet, wherein said second vapor outlet is configured to provide an outlet for coolant vapor.

11. The device of claim 10, wherein coolant fluid draining into said base plate flow channel is guided towards said first vapor outlet and said second vapor outlet.

12. The device of claim 11, wherein coolant fluid draining into said outer flow channel is combined with coolant fluid draining into said base plate flow channel and guided towards said first vapor outlet and second vapor outlet.

13. A device comprising:
    a heat exchanger configured to dissipate heat;
    a cover module including a liquid inlet, the cover module being configured to cover a heat sink mounted to a heat source, and wherein said cover module is further configured to be operable for allowing at least one of an entry of a coolant fluid from said heat exchanger or an exit of a heated coolant fluid to said heat exchanger;
    a central flow channel in fluid communication with the liquid inlet;
    a first plurality of curved fins comprising a plurality of curved inner fins including a first bending direction;
    a plurality of inner radial flow channels, where said plurality of inner radial flow channels comprise:
        an inner radial flow channels inlet; and
        an inner radial flow channels outlet in fluid communication with the inner radial flow channels inlet;
    a ring segment disposed around an outer perimeter of said plurality of inner fins, the ring segment being in fluid communication with the plurality of inner radial flow channels;
    a second plurality of curved fins comprising a plurality of curved outer fins, the plurality of curved outer fins include a second bending direction, wherein the first bending direction of said curved inner fins is different from said second bending direction of said plurality of curved outer fins;

a plurality of outer radial flow channels in fluid communication with the ring segment;
an outer flow channel in fluid communication with the plurality of outer radial flow channels and the heat exchanger.

14. The device of claim 13, wherein said inner radial flow channels outlet comprise a larger cross-sectional area than said inner radial flow channels inlet, and wherein a difference in cross-sectional area of inner radial flow channels inlet and inner radial flow channels outlet is configured to make coolant fluid flow divergent.

15. The device of claim 14, wherein divergent and curved flow channels are configured to increase a surface area of flow channels.

16. The device of claim 15, wherein the first bending direction of said curved inner fins comprise a clockwise direction and wherein the second bending direction of said curved outer fins comprise a counterclockwise direction.

17. The device of claim 13, further comprising:
an outer radial flow channels inlet; and
an outer radial flow channels outlet,
wherein said outer radial flow channels outlet comprise a larger cross-sectional area than said outer radial flow channels inlet, and wherein a difference in cross-sectional area of the outer radial flow channels outlet and the outer radial flow channels inlet is configured to make coolant fluid flow divergent.

18. The device of claim 17, further comprising:
a base plate flow channel, wherein coolant fluid out of said plurality of outer radial flow channels outlet drains into said base plate flow channel;
a first vapor outlet; and
a second vapor outlet.

19. The device of claim 18, wherein coolant fluid flowing into said base plate flow channel is guided towards said first vapor outlet and second vapor outlet.

* * * * *